United States Patent
Mulatti et al.

[11] Patent Number: 6,101,118
[45] Date of Patent: Aug. 8, 2000

[54] VOLTAGE REGULATOR FOR SINGLE FEED VOLTAGE MEMORY CIRCUITS, AND FLASH TYPE MEMORY IN PARTICULAR

[75] Inventors: Jacopo Mulatti, Latisana; Marcello Carrera, Trescore; Stefano Zanardi, Seriate; Maurizio Branchetti, San Paolo d'Enza, all of Italy

[73] Assignee: STMicroelectronics, S.r.l., Agrate Brianza, Italy

[21] Appl. No.: 09/196,204

[22] Filed: Nov. 20, 1998

[30] Foreign Application Priority Data

Nov. 21, 1997 [IT] Italy ................................. MI97A2594

[51] Int. Cl.[7] .................................................. G11C 11/24
[52] U.S. Cl. ...................................... 365/149; 365/189.09
[58] Field of Search ................................ 365/149, 189.09, 365/185.14, 189.07

[56] References Cited

U.S. PATENT DOCUMENTS 5,519,656  5/1996  Maccarrone et al. ............... 365/189.09
5,576,990  11/1996  Camerlenghi et al. ............ 365/185.23
5,652,722  7/1997  Whitefield .......................... 365/185.23

*Primary Examiner*—Richard Elms
*Assistant Examiner*—Anh Phung
*Attorney, Agent, or Firm*—Theodore E. Galanthay, Esq.; Robert Iannucci, Esq.; Seed I.P. Law Group, PLLC

[57] ABSTRACT

A voltage regulator for memory circuits has a differential stage having a non-inverting input terminal receiving a control voltage independent of the temperature; an inverting input terminal connected to a ground voltage reference; a feed terminal connected to a booster circuit adapted for producing a boosted voltage; and an output terminal connected to an output terminal of the voltage regulator, for producing an output voltage reference starting from the comparison of input voltages. The voltage regulator further comprises a connecting transistor inserted between the feed terminal and the output terminal of the differential stage, the connecting transistor being source follower having a control terminal connected to the output terminal of the differential stage, as well as a source terminal connected to the output terminal of the voltage regulator, in such a way as to self-limit the transition of the voltage on the output terminal.

14 Claims, 5 Drawing Sheets

VOLTAGE REGULATOR FOR SINGLE FEED VOLTAGE MEMORY CIRCUITS, AND FLASH TYPE MEMORY IN PARTICULAR

TECHNICAL FIELD

This invention relates to a voltage regulator for memory circuit.

The invention also refers to a program structure for the drain voltage of a single feed memory cell, of the type comprising at least one voltage regulator with an output terminal connected to a drain terminal of the memory cell by means of a series comprising a program selection block and a column decoder.

More in particular, but not limiting itself thereto, the invention concerns a voltage regulator for single voltage Flash memory cells and the following specification is specifically orientated towards this field of application with the sole scope of simplifying its presentation.

BACKGROUND OF THE INVENTION

As is well known, electrically programmable non-volatile memories are structured in cell matrix each of which comprises an MOS transistor with floating gate and relative areas of drain and source.

The programming of a memory cell is strongly influenced by a vd voltage applied to its drain terminal. In particular, for the non-volatile FLASH type memory cells, a reduced degree of vd drain voltage means a slow and insufficient programming of the cell, whilst an excessive degree of voltage leads to a partial erasing of the cell (so-called 'soft-erasing phenomenon').

The preceding considerations bring us to the conclusion that it is necessary to provide the circuit comprising the Flash memory with a voltage regulator which is particularly refined and precise in providing the correct drain voltage to the cells to be programmed.

A first technical solution known to satisfy this requirement consists of the so-called differential adjustment, illustrated in FIG. 1 for an M1 non-volatile single feed voltage memory cell.

In particular, the memory cell M1 is inserted between a ground voltage reference GND and a programming voltage reference Vpd. This programming voltage reference Vpd is suitably derived from a boosted voltage Vpump obtained by means of a booster circuit 1, for example of the load pump type.

The drain terminal D1 of the memory cell M1 is connected to the programming voltage reference Vpd via the series of a program selection block, or program load 2, and a column decoder 3. The program load block 2 consists conventionally of a logical inverter IL1 and a transistor M2, in particular of the PMOS type. In practice, the program load block 2 represents a family of 'on' switches for the column decoder 3.

The column decoder 3 consists of a chain of decoding transistors, having control terminals YO, YN, YM which are connected to a first reference voltage for the decoding of the Vpcy column.

The drain voltage Vd of the memory cell M1 is therefore given by the difference between the programming voltage Vpd and a $\Delta V_c$ equal to a drop in voltage due to the chain of decoding transistors YO, YN, YM, of the decoder 3, as well as serial resistors of the 'bit line', $r_d$, and of the source terminal, $r_s$:

$$Vd = Vpd - \Delta V_c \qquad (1)$$

In order to limit such a drop in $\Delta V_c$ voltage the Vpcy column decoder voltage to be applied to the terminal decoding ports of the transistor chain YO, YN, YM of the decoder 3 must be raised, in order to keep them in the so-called 'triode' operating zone.

The control terminal G1 of the memory cell M1 is in the same view connected to the second Vpcx row decoder voltage reference.

The programming voltage reference Vpd is on an output terminal OUT of a differential regulator 4.

Such differential regulator 4, comprising a differential stage 5 controlled by the boosted voltage Vpump generated by the booster circuit 1, is for limiting the current which flows in the M1 memory cell during the programming phase by stabilizing programming voltage Vpd.

Such differential stage 5 has an inverting input terminal 7, connected to a bandgap circuit 6, a non-inverting input terminal 8, connected to a ground reference GND by means of an initial R1 resistive element, and an output terminal 9, connected to the output terminal OUT of the differential regulator 4, as well as a feedback connection to a feed terminal 10 by means of a connecting transistor M3.

Such feed terminal 10 of the differential stage 5 is also connected to a booster circuit 1 which supplies the boosted voltage Vpump.

Furthermore, the output terminal OUT of the differential regulator 4 is connected to the ground reference GND by means of a filtering and compensation capacitance Cf as well as to the non-inverting input terminal 8 of the differential stage 5, by means of a second resistive element R2.

Thanks to the above mentioned differential regulator 4, the programming voltage Vpd for the drain terminal D1 of the memory cell M1 is obtained from a voltage control $V_{BG}$ supplied by a bandgap circuit 6 at the inverting input terminal 7 of the differential stage 5.

In particular, the connecting transistor M3 is a PMOS type pass transistor, controlled by the differential stage 5, in order to produce a voltage transfer between the boosted voltage Vpump and the programming voltage Vpd. Such pass transistor M3 puts the load pump booster in communication with the bit-line comprising the memory cell M1, therefore making full use of the boosted voltage Vpump.

In fact, when its control terminal receives the boosted voltage Vpump, the connecting transistor M3 is off and takes the programming voltage Vpd present on the output terminal OUT of the differential regulator 4 to ground GND. In parallel, when the control terminal thereof is subjected to a ground voltage GND, the connecting transistor M3 is operating in the ohmic zone and transfers the entire boosted voltage Vpump onto the output terminal OUT of the differential regulator 4.

In other words, the connecting transistor M3 switches the booster circuit 1 connection on and off at the charge pump with the bit-line of the memory cell M1.

Finally, the presence of the filtering and compensation capacitance Cf, in correspondence to the output terminal OUT of the differential regulator 4, carries out a compensation of the structure in its whole, allowing at the same time for a load storage which is useful in the first stages of the programming of the cell M1.

Such filtering and compensation capacitance Cf is conveniently of the value of some tens of picofarads. In mathematical terms, it introduces a pole in the transfer function of the differential regulator 4.

It is useful to note that the filtering and compensation capacitance Cf could not be substituted, for the scope of compensation, via a Miller capacitance placed between terminals 9 and OUT, since the difference of potential between these terminals can undergo inversions according to the conditions of the operating of the device.

The differential regulator 4 also has drawbacks, of which the most important is in that it makes use of a PMOS transistor as a connecting transistor M3.

In fact this PMOS transistor must be configured at a common source terminal (common source configuration), in this way making the loop gain of the structure comprising the differential regulator 4, the program load 2 and the column decoder 3 dependent on the number of cells programmed and increase accordingly, in consequence, the value of this gain.

More precisely, the loop gain of the structure is therefore given in the following formula:

$$G_{LOOP} = A_0(S) * g_{m(PMOS)} * R1/(1 + SCf(R1+R2)) \quad (2)$$

wherein: $A_0(S)$ is the gain of the differential stage 5;

$g_{m(PMOS)}$ is the transconductance of the PMOS type connecting transistor M3.

The loop gain $G_{LOOP}$ of the structure, represented by the above mentioned formula (2) depends disadvantageously on the number of programmed cells controlled by the differential stage 5. In fact, the $g_{m(PMOS)}$ transconductance of the connecting transistor M3 increases as the current absorbed at the output terminal OUT of the differential regulator 4 increases, this current depending on the number of cells programmed (i.e., the number of cells where current flows through). The increase of the $g_{m(PMOS)}$ transconductance causes an increase in the loop $G_{LOOP}$ gain when the differential regulator 4 is stimulated, that is to say when the memory cells connected thereto absorb current. In particular, the phase margin of this loop gain $G_{LOOP}$ is dangerously reduced.

In a simulation carried out by the applicants themselves, it was possible to note an increase in the loop $G_{LOOP}$ gain at zero frequency from a value of 32 (with an unloaded regulator) to a value of 250, in the particular case of eight programmed cells connected to the differential regulator 4.

The filtering and compensation capacitance Cf introduces a dominant pole into the loop $G_{LOOP}$ gain structure.

Because of the dependence of this gain from the number of programmed cells controlled by the differential 5 stage, this capacitance must therefore be oversized based on the critical case, in order to guarantee structure stability in all operative conditions, even in the presence of significant increases of the $g_{m(PMOS)}$ transconductance.

All this means a penalizing increase in the silicon area required for the integration of the structure in its whole.

Furthermore, in the programming phase, when the program loads 2 are enabled a higher flux of current starts to flow towards the drain terminals of the programmed memory cells to be programmed. In this case, the programming voltage Vpd undergoes a dramatic drop: the differential stage 5 can come out of its linear dynamics and lose its connection with the programmed voltage Vpd.

The PMOS connecting transistor M3 continues to conduct, but without being able to control the current flowing towards the programming memory cells to be programmed, also because of its configuration at common source.

The output terminal OUT, on which the programming voltage Vpd is present, is therefore recharged by the differential stage 5 without any control by the introduced reaction, in normal circumstances.

This situation remains until the differential 5 stage returns to linear dynamics.

All this can cause undesired spikes or surges in the drain voltage of the memory cells to be programmed, as schematically shown in FIG. 2. In particular, FIG. 2 shows the results of a simulation carried out by the applicants themselves, in the case of the programming of 4 memory cells using respectively filtering and compensation capacitance Cf of 50 and 100 pF. This easily shows that with filtering and compensation capacitance Cf of higher values the spike or surge in the drain voltage of the programmed cells to be programmed is damped.

The only solution to obviate this dangerous situation is therefore by employing the filtering and compensation capacitance Cf with an extremely high value, with above disclosed disadvantageous consequences in terms of occupation of the areas of integration.

More precisely, since the slew-rate of the structure in its whole is proportional to the gain*band product, in order to slow down the upward transitory of the programmed voltage Vpd, in the unhooking conditions of the feedback introduced at the differential stage 5, it is necessary to increase the value of the filtering and compensation capacitance Cf to 100 pF, with an increase of occupied silicon area which is absolutely infeasible.

SUMMARY OF THE INVENTION

An embodiment of this invention is directed to a differential voltage regulator for single feed voltage memory cells, with structural and functional characteristics which allow problems to be overcome which at the moment limit the regulators designed according to prior art.

The embodiment uses a voltage regulator of differential type, comprising a connecting transistor modified and designed in such a way as to control with its output any number of memory cells without influencing the loop gain of the structure comprising the regulator and the cells to be controlled.

In particular, such a modified connecting transistor eliminates the dependence of the loop gain $G_{LOOP}$ of the structure in its whole from the current absorbed by the controlled memory cells.

Therefore, this means using a configured transistor as source follower, in particular an NMOS transistor, created by means of a triple well structure.

The embodiment is directed to a voltage regulator for memory circuits, comprising at least one differential stage for producing an output reference voltage adapted for producing an input voltage, and a booster circuit adapted for producing a boosted voltage, as well as a connecting transistor connected to an output voltage regulator terminal for connecting an output terminal in feedback of the differential stage to its control terminal and configured as a source follower in such a way as to self-limit the transition of the voltage on the above mentioned output terminal.

This connecting transistor presents a drain terminal which is connected to a booster circuit and is produced with triple-well CMOS technology, it is in particular an NMOS type pass transistor.

Advantageously according to the embodiment of the invention, the NMOS type triple-well pass transistor puts the voltage booster in communication with the memory cell and allows for the full use of the boosted voltage.

The booster circuit of the voltage regulator, according to the embodiment of the invention, includes a load pump circuit adapted for boosted voltage, this regulator also including a voltage generating circuit which generates a voltage independent from the bandgap type temperature.

Furthermore the differential stage of the voltage regulator, according to the embodiment of the invention has an inverting input terminal connected to the reference of ground voltage by means of an initial resistive element and to the out-put terminal of the voltage regulator by means of a second resistive element, this voltage regulator also includes a filtering and compensation capacitance installed between its output terminal and of the ground voltage reference and is connected to the inverted input terminal of the differential stage, as well as to the inverted input terminal of the differential stage via the second resistive element.

Such filtering and compensation capacitance introduces a pole in the loop gain of the programming structure of the memory cell with single feed voltage according to the invention; a significant reduction of the loop gain and its independence from regulator load conditions is obtained, that is from the significant number of cells to be programmed.

Furthermore, the frequency increase of the pole introduced by the filtering and compensation capacitance allows these to be used at lower values with respect to the prior art.

More specifically, the embodiment of the invention refers to a voltage regulator for memory circuits comprising at least one differential stage having: an input terminal non-inverting voltage control receiver independent of the temperature;

an inverting input terminal connected to an earth ground reference;

a feed terminal connected to a positive voltage booster circuit which delivers a boosted voltage; and an output terminal connected to an output terminal of the voltage regulator, in order to produce an output reference voltage from the comparison of input voltage; the voltage regulator further comprising:

a connecting transistor inserted between the feed terminal and the output terminal of the differential stage.

Another embodiment of the invention is directed to a programming structure for the drain voltage of a single feed memory cell, comprising at least one voltage regulator according to the invention, with an output terminal connected to the drain terminal of the memory cell by means of a series of program selection block, and column decoder, in such a way as to self-limit the charge current of the drain terminals of the cells to which this voltage regulator is connected.

The use of a triple-well NMOS transistor as a connecting transistor gives the advantage of eliminating the body effect, therefore guaranteeing the correct operation of the programming structure of the memory cell in its whole.

Furthermore, when the reaction due to the differential stage is switched off, for example at the beginning of a programming impulse (something which, in the prior art structure, caused an uncontrolled recharge of the output terminal) the modified connecting transistor self-limits the charge current of the drain cell terminals to which the regulator is connected thanks to its source follower configuration.

The features and the advantages of the voltage regulator comprising a modified connecting transistor, according to this invention, will become clear from the following specification of an embodiment thereof, which is herein set as example for descriptive and non limiting purposes, with reference to the attached drawings.

DETAILED DESCRIPTION

Figure 1:
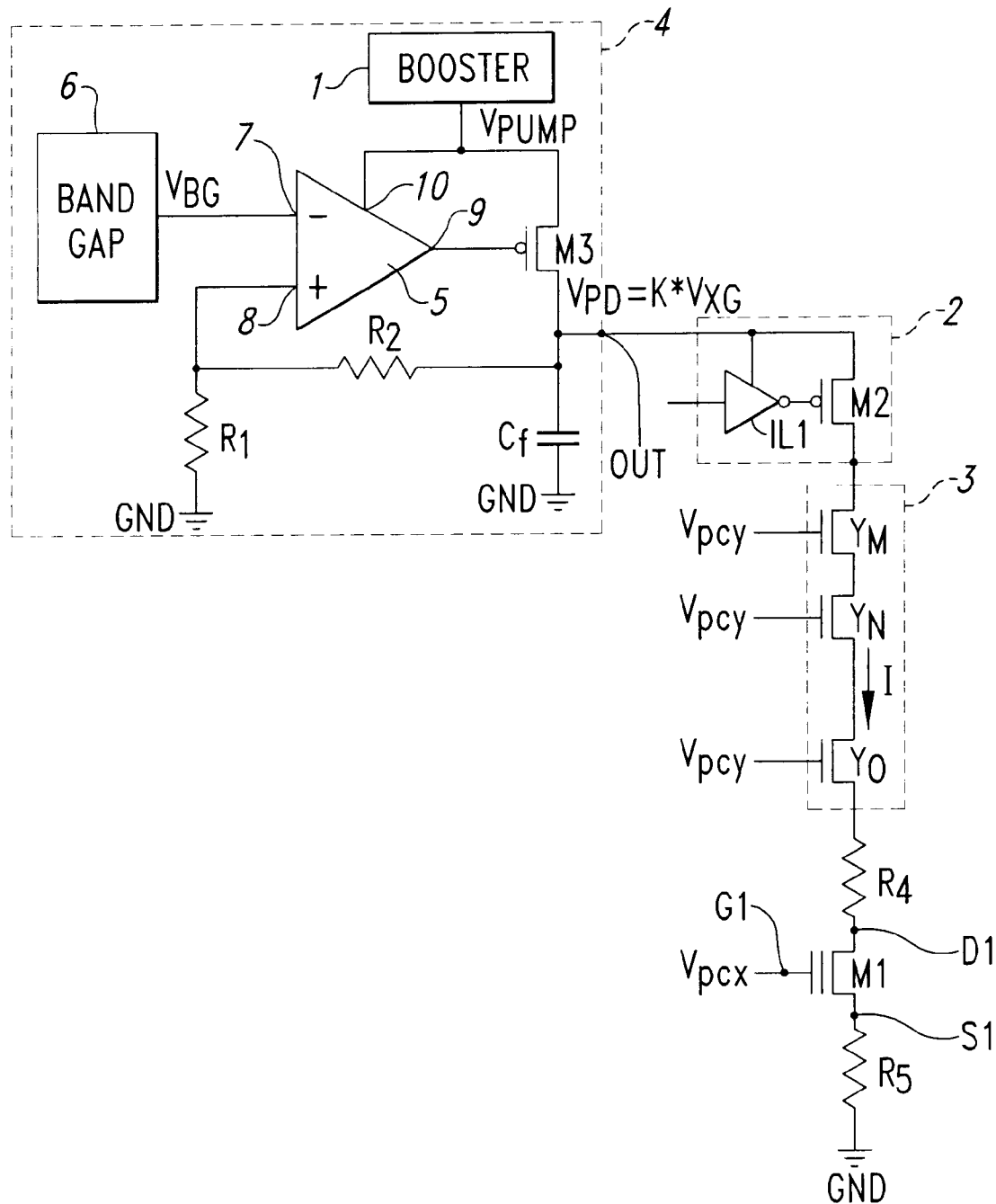
FIG. 1 shows a differential programming voltage regulator for a single feed memory cell of the prior art.
Figure 2:
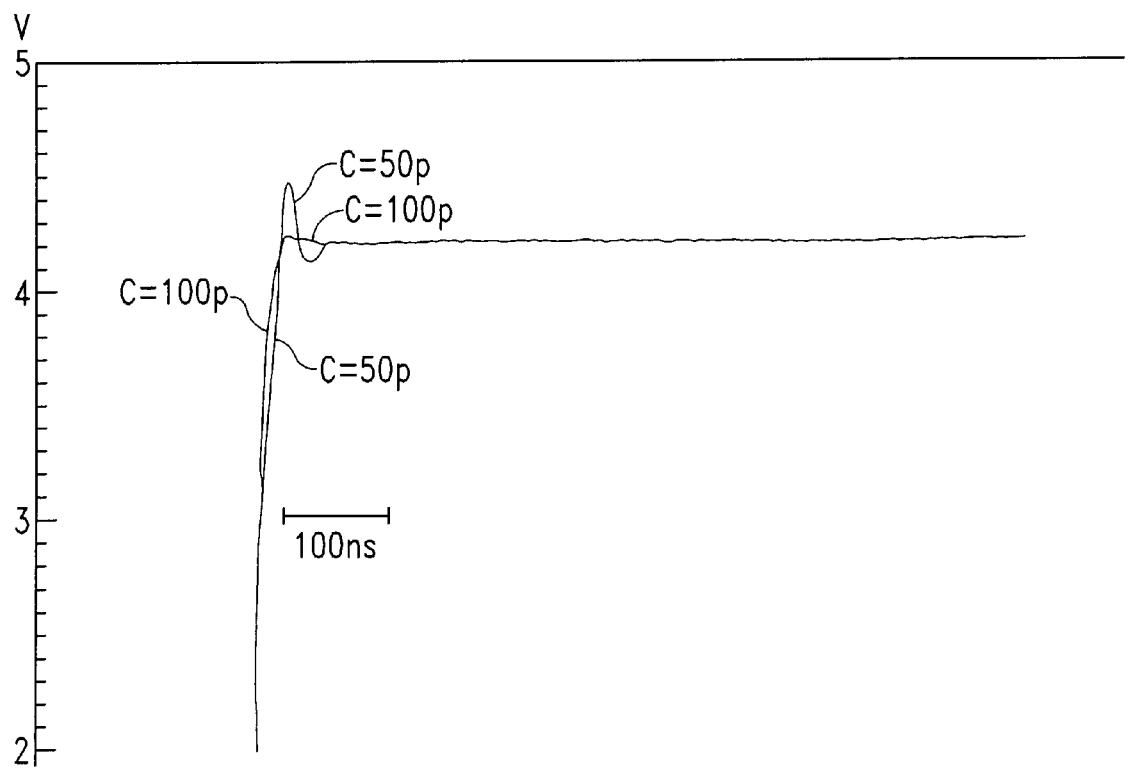
FIG. 2 shows the pattern of the voltage applied to the drain terminal of the cells to be programmed by the differential regulator according to prior art, particularly in unhooked conditions.
Figure 3:
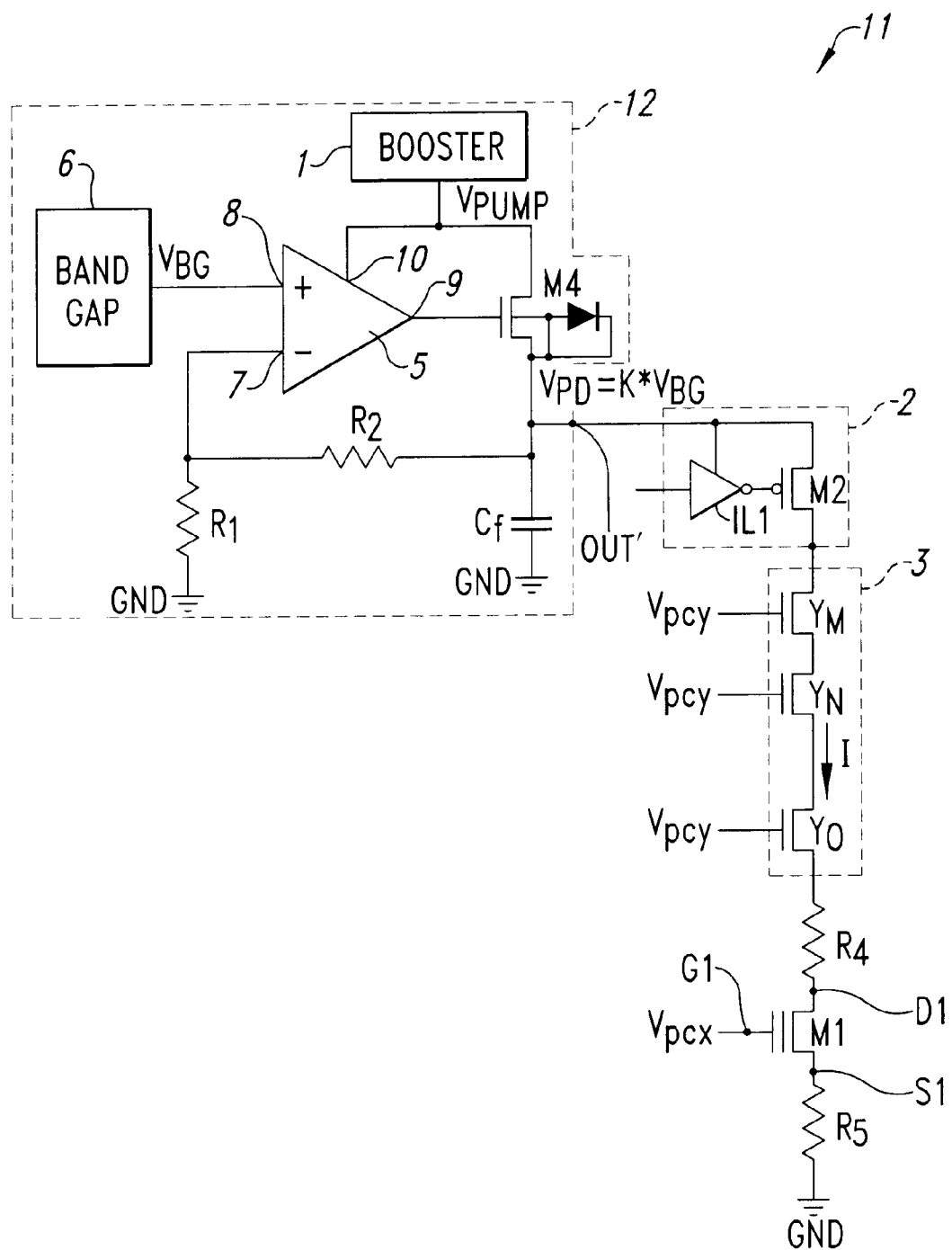
FIG. 3 shows a differential regulator comprising a connecting transistor modified according to the invention.

With reference to FIG. 3, the programming structure of a single feed voltage memory cell M1 is in its whole and schematically indicated including a differential regulator according to an embodiment of the invention.

In the specification herein below the alphanumeric references have been maintained for similar elements to those described for the differential regulator according to prior art.

The memory cell M1 is inserted between a ground voltage reference GND and a programming voltage reference Vpd. This programming voltage reference Vpd is suitably derived from a boosted voltage Vpump obtained via a booster circuit 1, in particular of the charge pump type.

The drain terminal D1 of the memory cell M1 is connected to the programming voltage reference Vpd by means of a series comprising a program selection block, or program load 2, and a column decoder 3.

The voltage programming reference is present on the output terminal OUT' of the modified differential regulator 12 according to the invention.

This modified differential regulator 12 includes a differential stage 5 fed by the boosted voltage Vpump generated by the booster circuit 1, and is for limiting the current flowing into the memory cell M1 during the phase of programming, by stabilizing the programming voltage Vpd.

The differential stage 5 particularly presents a non-inverting input terminal 8 connected to a bandgap circuit 6, an inverting input terminal 7, connected to the ground reference GND via a first resistive element R1, and an output terminal 9, connected to a output terminal OUT' of the modified differential regulator 12, as well as in feedback to one of its own feed terminal 10 via a modified connecting transistor M4.

Such feed terminal 10 of the differential stage 5 is furthermore connected to the booster circuit 1 which supplies the boosted voltage Vpump.

The modified connecting transistor M4 has its control terminal connected to the output terminal 9 of the differential stage 5, its source terminal connected to the output terminal OUT' of the modified differential regulator 12 and its drain terminal connected to the booster circuit 1.

It is useful to note that the modified connecting transistor M4 has been explained for simplicity of display, but can be part of an operational amplifier further comprising the differential stage 5.

Finally, the output terminal OUT' of the modified differential regulator 12 is connected to the ground reference GND via a filtering and compensation capacitance Cf; as well as to the inverting input terminal 7 of the differential stage 5, by means of a second resistive element R2.

Using the modified differential regulator 12 according to the invention, the programming voltage Vpd for the drain terminal D1 of the memory cell M1 is still obtained starting from a control voltage $V_{BG}$ supplied by the bandgap circuit 6 to the non-inverting input terminal 8 of the differential stage 5.

Advantageously according to the embodiment of the invention, the modified connecting transistor M4 is a pass transistor of the NMOS triple well type, controlled by the differential stage 5, in order to carry out a voltage transfer between the boosted voltage Vpump and the programming voltage Vpd. Such pass transistor M4 puts the booster circuit 1 at charge pump in communication with the bit-line comprising the memory cell M1 and allows for the full use of the boosted voltage Vpump.

In fact, such modified connecting transistor M4 is advantageously designed as a source follower.

The use of a triple well transistor NMOS as a connecting transistor presents the advantage of being able to eliminate the body effect, so guaranteeing that the voltage VGS to be applied to its port terminal is anyway above the programming voltage Vpd for not more than the Vt value corresponding to the intrinsic threshold of the modified connecting transistor M4.

Furthermore, being a modified NMOS triple well connecting transistor configured as source follower, the expression of the loop gain of the programming structure 11 of the memory cell M1 with a single feed voltage is given by the following expression:

$$G_{LOOP}=A_0(S)*(g_{m(NMOS)}*(R1+R2))/(1+g_{m(NMOS)}*(R1+R2)+SCf(R1+R2)) \quad (3)$$

wherein:

$A_0$ (S) is the gain of the differential stage 5; and $g_{m(NMOS)}$ is the transconductance of the modified NMOS triple well type connecting transistor M4.

When the modified connecting transistor M4 is conducting, the product $g_{m(NMOS)}*(R1+R2)$ is much greater than 1. In this case the expression (3) is simplified in the following way:

$$G_{LOOP}=A_0(S)*R1/(R1+R2)/(1+SCf/g_{m(NMOS)}) \quad (4)$$

The comparison of the expressions of loop gain of the structure according to prior art (2) and of the programming structure 11 of a single feed voltage memory cell M1 according to the invention (4) shows the following advantages of the use of the modified differential regulator 12:

the filtering and compensation capacitance Cf still introduces a pole in the expression (4) of the loop gain $G_{LOOP}$ of the programming structure 11 of a single feed voltage memory cell M1 according to the invention;

the loop gain $G_{LOOP}$ at zero frequency is reduced by a factor equal to $g_{m(PMOS)}*R1$ compared to the corresponding value at zero frequency of the structure according to prior art; but this value is advantageously independent though from the current which circulates in the modified connecting transistor M4, since it does not depend upon the transconductance $g_{m(NMOS)}$ of the connecting transistor as happened for the structure according to prior art;

the pole introduced by the reaction net comprised in the modified differential regulator 12 according to the invention, at the same filtering and compensation capacitance Cf, is shifted by a value equal to $g_{m(NMOS)}*(R1+R2)$ compared to the known structure; and the NMOS triple well type transistor used for the modified connecting transistor M4 has a threshold voltage Vt which is independent from the voltage present on the output OUT' terminal of the modified differential regulator 12.

During a simulation carried out by the applicants themselves, it was possible to see a significant reduction of the loop gain $G_{LOOP}$ of the structure 11 according to the invention. It was also shown that this loop gain $G_{LOOP}$ no longer depends on the conditions of load of the modified differential regulator 12, that is to say from the number of cells to be programmed.

Furthermore, the increase of frequency of the pole introduced by the filtering and compensation capacitance Cf in the transfer function of the structure 11 according to the invention increases the phase margin of such structure, allowing for the use of filtering and compensation capacitance Cf of lower value compared to the structure according to prior art.

Figure 4:
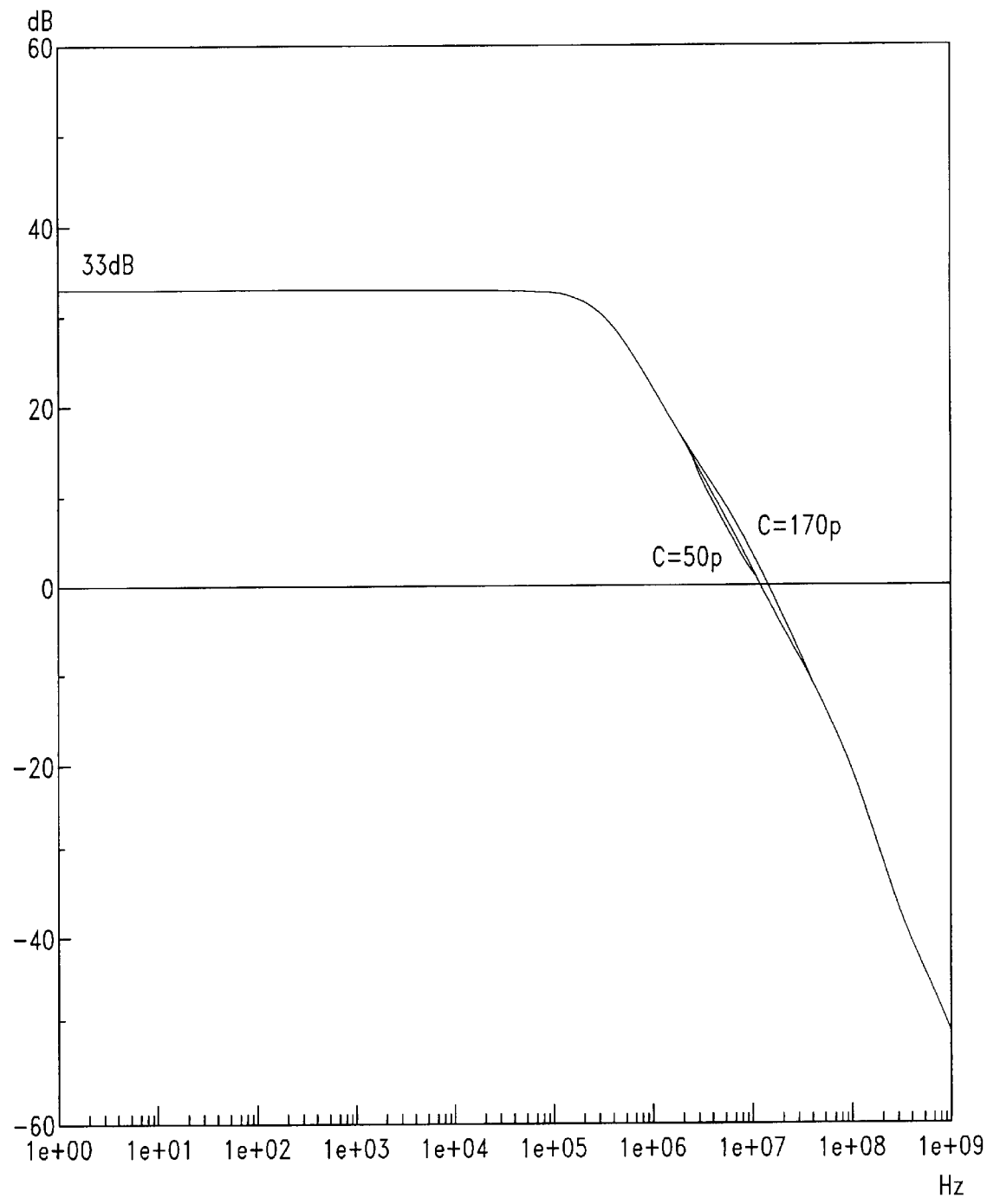
FIG. 4 schematically shows the pattern of the loop gain of a structure including the differential regulator modified according to the invention.

The pattern of the loop gain $G_{LOOP}$ of structure 11 is schematically illustrated in FIG. 4 according to the invention for different values of the filtering and compensation capacitance Cf. It is immediately evident from this figure that the value of the filtering and compensation capacitance Cf only marginally influences these patterns.

All this comes to the conclusion that the pole introduced by the filtering and compensation capacitance Cf, as other non-dominant poles of the gain of the differential stage 5 $A_0$ (S) are repositioned, by means of the use of a modified differential regulator 12 according to the invention, below the 0 dB axis.

In this situation, at the filtering and compensation capacitance Cf it is no longer necessary to delegate the task of compensating the structure 11. It is therefore advantageously possible according to the invention to reduce the dimensions of this capacitance, diminishing the problems of occupation of space thereto connected.

Finally, advantageously according to the invention, the modified connecting transistor M4 designed as source follower self-limits the transition of the programming voltage Vpd re-hooking the feedback in case the differential stage 5 should come out of the linear dynamics.

In fact, when the reaction due to the differential stage 5 becomes unhooked, for example at the start of a programming impulse (something which, according to the prior art structure, caused an uncontrolled recharge of the output terminal OUT) the modified NMOS connecting transistor M4 self-limits the charge current of the drain terminals of the cells to which the modified differential regulator 12 according to the invention is connected thanks to its source follower configuration.

In other words, the more the programming voltage Vpd is increased on the terminal OUT' the more the gate source voltage $V_{GS}$ of the transistor M4 is reduced and with it the charge current of the memory cells M1.

Figure 5:
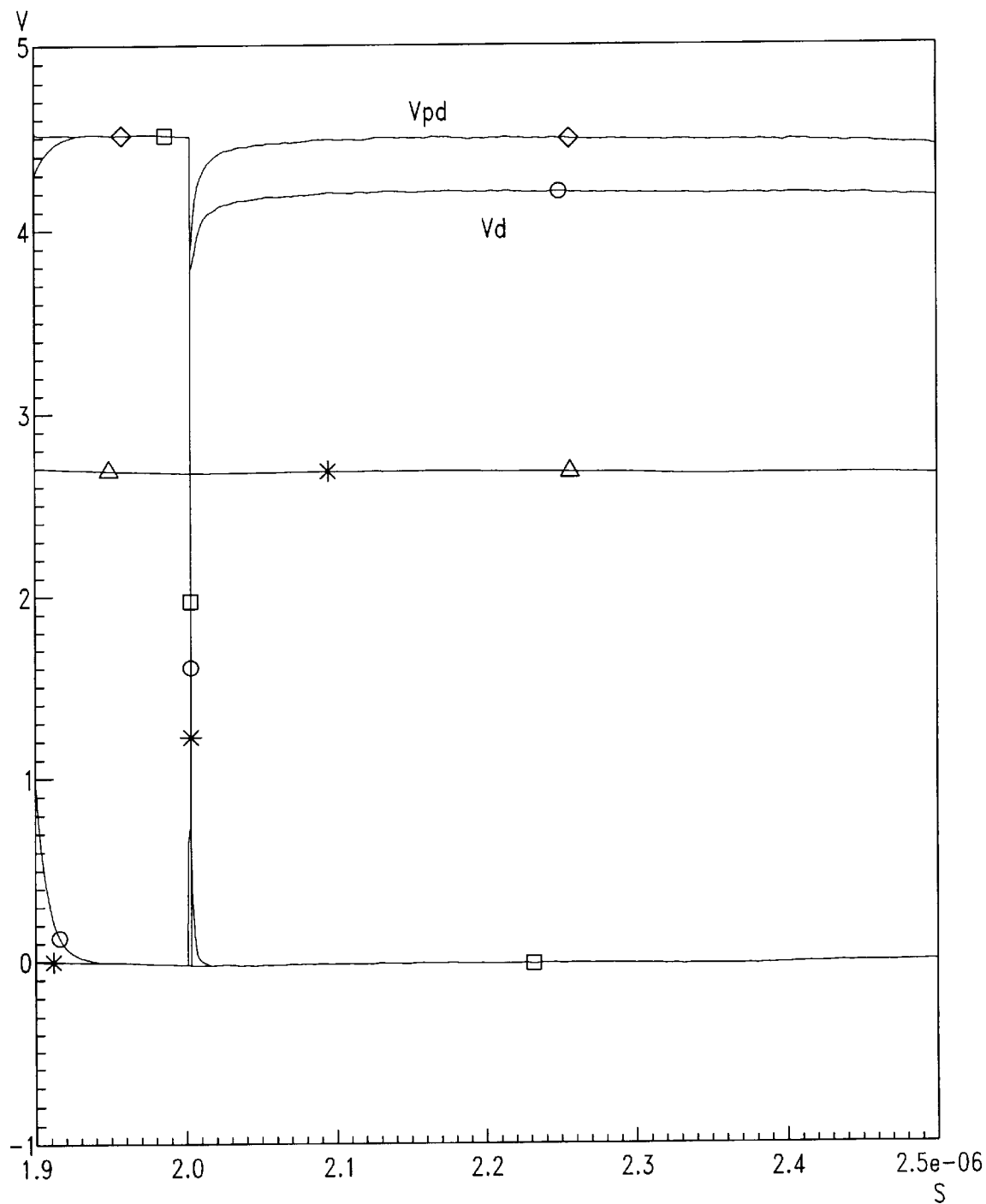
FIG. 5 schematically shows the pattern of the drain voltage of the cells to be programmed via the differential regulator modified according to the invention, particularly in regulative unhooked conditions.

The result of this process is illustrated in FIG. 5, which shows how structure 11, using the modified differential regulator 12 according to the invention, shows an initial transitory of the drain voltage Vd of the memory cells to be programmed, thereby reducing their stress.

This improvement in the transitory of the drain voltage Vd and the consequent reduction of stress for the cells to be programmed allows for more reduced dimensions of the filtering and compensation capacitance cf to be used.

What is claimed is:

1. A voltage regulator for memory circuits, comprising:
a booster circuit that supplies a boosted voltage;

a differential stage having a non-inverting input terminal receiving a control voltage independent of temperature; an inverting input terminal connected to a ground voltage reference; a feed terminal connected to the booster circuit to receive the boosted voltage; and an output terminal connected to an output terminal of the voltage regulator, for producing an output voltage reference based on a comparison of the voltages at the input terminals of the differential stage; and a connecting transistor inserted between the feed terminal and the output terminal of the differential stage, wherein said connecting transistor is configured as source follower and has a control terminal connected to said output terminal of the differential stage, a drain terminal connected to the booster circuit, and a source terminal connected to the output terminal of the voltage regulator, in such a way as to self-limit a transition of a voltage on said output terminal.

2. The voltage regulator according to claim 1, wherein said connecting transistor is provided in CMOS triple well technology.

3. The voltage regulator according to claim 2, wherein said connecting transistor is an NMOS type pass transistor.

4. The voltage regulator according to claim 1, wherein said booster circuit comprises a charge pump circuit for generating the boosted voltage.

5. The voltage regulator according to claim 1, wherein said regulator comprises a bandgap generator voltage circuit independent of the temperature connected to the non-inverting input terminal of the differential stage.

6. The voltage regulator according to claim 1, wherein the inverting input terminal of the differential stage is connected to the ground voltage reference via a first resistive element and to the output terminal of the voltage regulator by a second resistive element.

7. The voltage regulator according to claim 1, further comprising a filtering and compensation capacitance connected between the output terminal of the voltage regulator and the ground voltage reference and connected to the inverting input terminal of the differential stage.

8. The voltage regulator according to claim 7, wherein said filtering and compensation capacitance is connected to the inverting input terminal of the differential stage by a resistive element.

9. A programming structure for a drain voltage of a single feed memory cell, comprising a voltage regulator having an output terminal connected to a drain terminal of the memory cell by a series of a program selection block and a column decoder, wherein the voltage regulator is designed according to claim 1, in such a way as to self-limit a charge current of the drain terminal of the cell to which such voltage regulator is connected.

10. A differential voltage regulator, comprising:

an output terminal;

a differential stage having first and second input terminals and an output terminal, the first input terminal receiving a control voltage and the second input terminal receiving a voltage reference; and a connecting transistor configured as a source follower and having a control terminal and first and second terminals, the control terminal being coupled to the output terminal of the differential stage and the second terminal being coupled to the output terminal of the voltage regulator, wherein the connecting transistor is an NMOS triple-well transistor.

11. The voltage regulator of claim 10 wherein the differential stage includes a feed terminal and the voltage regulator further comprises a booster circuit having an output node coupled to the feed terminal and to the first terminal of the connecting transistor.

12. A differential voltage regulator, comprising:

an output terminal;

a differential stage having first and second input terminals and an output terminal, the first input terminal receiving a control voltage and the second input terminal receiving a voltage reference;

a connecting transistor configured as a source follower and having a control terminal and first and second terminals, the control terminal being coupled to the output terminal of the differential stage and the second terminal being coupled to the output terminal of the voltage regulator; and a bandgap generator circuit having an output node coupled to the first input terminal of the differential stage, the bandgap generator circuit producing the control signal which is independent of a temperature of the voltage regulator.

13. A differential voltage regulator, comprising:

an output terminal;

a differential stage having first and second input terminals and an output terminal, the first input terminal receiving a control voltage and the second input terminal receiving a voltage reference;

a connecting transistor configured as a source follower and having a control terminal and first and second terminals, the control terminal being coupled to the output terminal of the differential stage and the second terminal being coupled to the output terminal of the voltage regulator;

a first resistor coupled between the second input terminal of the differential stage and the voltage reference; and a second resistor coupled between the second input terminal of the differential stage and the second terminal of the connecting transistor.

14. A differential voltage regulator, comprising:

an output terminal;

a differential stage having first and second input terminals and an output terminal, the first input terminal receiving a control voltage and the second input terminal receiving a voltage reference;

a connecting transistor configured as a source follower and having a control terminal and first and second terminals, the control terminal being coupled to the output terminal of the differential stage and the second terminal being coupled to the output terminal of the voltage regulator; and a filtering and compensation capacitance coupled between the voltage reference and the second terminal of the connecting transistor.

* * * * *